(12) United States Patent
Maeda et al.

(10) Patent No.: US 10,442,372 B2
(45) Date of Patent: Oct. 15, 2019

(54) VEHICLE-MOUNTED POWER DISTRIBUTION BOARD, ELECTRICAL JUNCTION BOX, AND CHARGING/DISCHARGING CONTROLLER

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Hirotoshi Maeda, Mie (JP); Yoshihiro Tozawa, Mie (JP)

(73) Assignees: AutoNetworks Technologies, Ltd., Yokkaichi, Mei (JP); Sumitomo Wiring Systems, Ltd., Yokkaichi, Mei (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 15/560,758

(22) PCT Filed: Mar. 28, 2016

(86) PCT No.: PCT/JP2016/059839
§ 371 (c)(1),
(2) Date: Sep. 22, 2017

(87) PCT Pub. No.: WO2016/158826
PCT Pub. Date: Oct. 6, 2016

(65) Prior Publication Data
US 2018/0079377 A1 Mar. 22, 2018

(30) Foreign Application Priority Data
Mar. 27, 2015 (JP) .................................. 2015-066281

(51) Int. Cl.
*H05K 1/02* (2006.01)
*H05K 7/20* (2006.01)
(Continued)

(52) U.S. Cl.
CPC ...... *B60R 16/0238* (2013.01); *B60R 16/0239* (2013.01); *B60R 16/03* (2013.01);
(Continued)

(58) Field of Classification Search
CPC .................. H05K 7/2089–209; H05K 1/0203
See application file for complete search history.

(56) References Cited

U.S. PATENT DOCUMENTS

| 5,180,942 A | * | 1/1993 | Marvin | ..................... H03H 9/08 310/343 |
| 5,426,303 A | * | 6/1995 | Owen | ..................... H01L 37/02 250/332 |

(Continued)

FOREIGN PATENT DOCUMENTS

| JP | 2000-083310 A | 3/2000 |
| JP | 2003-164039 A | 6/2003 |

(Continued)

OTHER PUBLICATIONS

Search Report for PCT/JP2016/059839, dated May 24, 2016.

*Primary Examiner* — Robert J Hoffberg
(74) *Attorney, Agent, or Firm* — Honigman LLP

(57) ABSTRACT

A vehicle-mounted power distribution board includes: a circuit structure including a control circuit board including a conductive path on at least one of a front surface and a back surface, and a plurality of bus bars that is placed on the control circuit board, and that is composed of a plurality of bus bars; and a plurality of electronic components that are mounted to the circuit structure. Some of the plurality of electronic components are semiconductor elements that gen- (Continued)

erate heat when current flows through it, and the other components are low heat resistant electrolytic capacitors and integrated circuits that are influenced by heat transferred from the semiconductor elements. Bus bar non-arrangement regions in which no bus bar is disposed are formed in the circuit structure, and the low heat resistant electrolytic capacitors and the integrated circuits are disposed in the bus bar non-arrangement regions.

13 Claims, 3 Drawing Sheets

(51) Int. Cl.
    *B60R 16/023*     (2006.01)
    *B60R 16/03*     (2006.01)
    *H02B 1/20*     (2006.01)
    *H02J 7/00*     (2006.01)

(52) U.S. Cl.
    CPC .............. *H02B 1/20* (2013.01); *H02J 7/0068* (2013.01); *H05K 1/0203* (2013.01); *H05K 7/209* (2013.01); *H05K 7/20518* (2013.01)

(56) References Cited

U.S. PATENT DOCUMENTS

| | | | | |
|---|---|---|---|---|
| 5,602,392 A * | 2/1997 | Owen | ............... | H01L 27/14623 250/332 |
| 5,900,649 A * | 5/1999 | Effelsberg | ............ | H05K 1/0201 257/440 |
| 6,205,028 B1 * | 3/2001 | Matsumura | .......... | H05K 1/0201 174/252 |
| 6,573,704 B2 * | 6/2003 | Mirov | ....................... | G01K 1/20 174/252 |
| 6,822,325 B2 * | 11/2004 | Wong | ................ | H01L 21/76224 257/717 |
| 6,844,575 B2 * | 1/2005 | Shirakawa | ............ | H01L 23/367 257/197 |
| 6,880,970 B2 * | 4/2005 | Mirov | ....................... | G01K 1/20 374/208 |
| 6,940,164 B1 * | 9/2005 | Yoshimatsu | ............ | H01L 23/13 257/725 |
| 7,317,248 B2 * | 1/2008 | Poechmueller | .......... | G11C 5/04 257/713 |
| 7,663,891 B2 * | 2/2010 | Tanaka | ................. | H05K 1/0201 361/760 |
| 8,183,574 B2 * | 5/2012 | Ferru | .................... | H01L 25/167 257/79 |
| 8,335,077 B2 * | 12/2012 | Rijken | ...................... | G01K 1/20 174/252 |
| 9,159,642 B2 * | 10/2015 | Kim | ................. | H01L 23/3738 |
| 9,167,723 B1 * | 10/2015 | Kim | ................. | H05K 7/20418 |
| 9,743,555 B2 * | 8/2017 | Kim | ................. | H05K 7/20409 |
| 10,193,412 B2 * | 1/2019 | Araki | .................. | H05K 1/0201 |
| 10,194,523 B2 * | 1/2019 | Sumida | ................ | H05K 7/1432 |
| 10,251,261 B2 * | 4/2019 | Chin | ..................... | H05K 1/0263 |
| 2003/0137813 A1 | 7/2003 | Onizuka et al. | | |
| 2014/0290926 A1 * | 10/2014 | Kim | ..................... | H01L 23/3738 165/185 |
| 2015/0230352 A1 | 8/2015 | Hashikura | | |
| 2015/0373827 A1 * | 12/2015 | Guo | ..................... | H05K 1/0201 361/704 |

FOREIGN PATENT DOCUMENTS

| | | |
|---|---|---|
| JP | 3927017 B2 | 3/2007 |
| JP | 2014-057390 A | 3/2014 |
| KR | 20160107856 A * | 9/2016 |

\* cited by examiner

VEHICLE-MOUNTED POWER DISTRIBUTION BOARD, ELECTRICAL JUNCTION BOX, AND CHARGING/DISCHARGING CONTROLLER

CROSS-REFERENCE TO RELATED APPLICATIONS

This application is the U.S. national stage of PCT/JP2016/059839 filed Mar. 28, 2016, which claims priority of Japanese Patent Application No. JP 2015-066281 filed Mar. 27, 2015.

TECHNICAL FIELD

The technology disclosed herein relates to a vehicle-mounted power distribution board, an electrical junction box, and a charging/discharging controller.

BACKGROUND

As a vehicle-mounted power distribution board that is mounted to a vehicle and has the function of distributing power from a power supply to various vehicle-mounted electric/electronic components, a board is known that includes a circuit structure including a plurality of bus bars and a control circuit board, and electronic components such as a semiconductor element that are mounted to the circuit structure.

Meanwhile, components such as a semiconductor element tend to generate heat and undergo temperature increase during operation. In particular, in the case of such a substrate that allows a large current to flow therethrough, the generated heat may be transferred through a bus bar and a copper foil serving as the conductive materials, as well as a control circuit board to other components that are likely to be influenced by heat, resulting in a failure in the other components.

SUMMARY

A technique disclosed herein is directed to a vehicle-mounted power distribution board including: a circuit structure including a control circuit board including a conductive path on at least one of a front surface and a back surface, and a bus bar placed on the control circuit board; and a plurality of electronic components that are mounted to the circuit structure, wherein the plurality of electronic components include a heat generating component that generates heat when current flows through it, and a low heat resistance component that is influenced by heat transferred from the heat generating component, the circuit structure is provided with a bus bar non-arrangement region in which no bus bar is disposed, and the low heat resistance component is disposed in the bus bar non-arrangement region.

Another technique disclosed herein is directed to an electrical junction box including: the vehicle-mounted power distribution board having the above-described configuration; and a case that accommodates the vehicle-mounted power distribution board.

Yet another technique disclosed herein is directed to a charging/discharging controller that is disposed between a vehicle-mounted power supply and a vehicle-mounted electric/electronic component and that controls a voltage of power supplied from the vehicle-mounted power supply and distribution of power to the vehicle-mounted electric/electronic component, including: the vehicle-mounted power distribution board having the above-described configuration and a case that accommodates the vehicle-mounted power distribution board.

With the above-described configuration, it is possible to inhibit transfer of heat from the heat generating component through the bus bars to the low heat resistance component.

As embodiments of the techniques disclosed herein, the following configurations are preferable.

At least part of the bus bar non-arrangement region may serve as a conductive path non-arrangement region in which no conductive path is disposed, and the low heat resistance component may be disposed in the conductive path non-arrangement region. With such a configuration, it is possible to inhibit transfer of heat from the heat generating component through the conductive path to the low heat resistance component.

The control circuit board may include a slit that separates the heat generating component and the low heat resistance component. With such as configuration, it is possible to inhibit transfer of heat from the heat generating component through the control circuit board to the low heat resistance component.

The circuit structure may be disposed in a vertical orientation, the low heat resistance component may be disposed laterally or upward of the heat generating component that is mounted to the circuit structure, and the slit may be disposed so as to separate the heat generating component and the low heat resistance component.

Here, the surrounding air that has been heated by the heat generated from the heat generating component moves upward. Therefore, the low heat resistance component disposed laterally or upward with respect to the heat generating component is more likely to be influenced by heat than the low heat resistance component disposed downward with respect to the heat generating component. Accordingly, by disposing the slit so as to separate the heat generating component and the low heat resistance component that is disposed laterally or upward with respect to the heat generating component, it is possible to more sufficiently inhibit transfer of heat from the heat generating component to the low heat resistance component.

Advantageous Effects of Invention

According to the techniques disclosed herein, it is possible to provide a vehicle-mounted power distribution board, an electrical junction box, and a charging/discharging controller that can inhibit transfer of heat from the heat generating component to the other components that are likely to be influenced by heat.

DETAILED DESCRIPTION OF PREFERRED EMBODIMENTS

Figure 2:
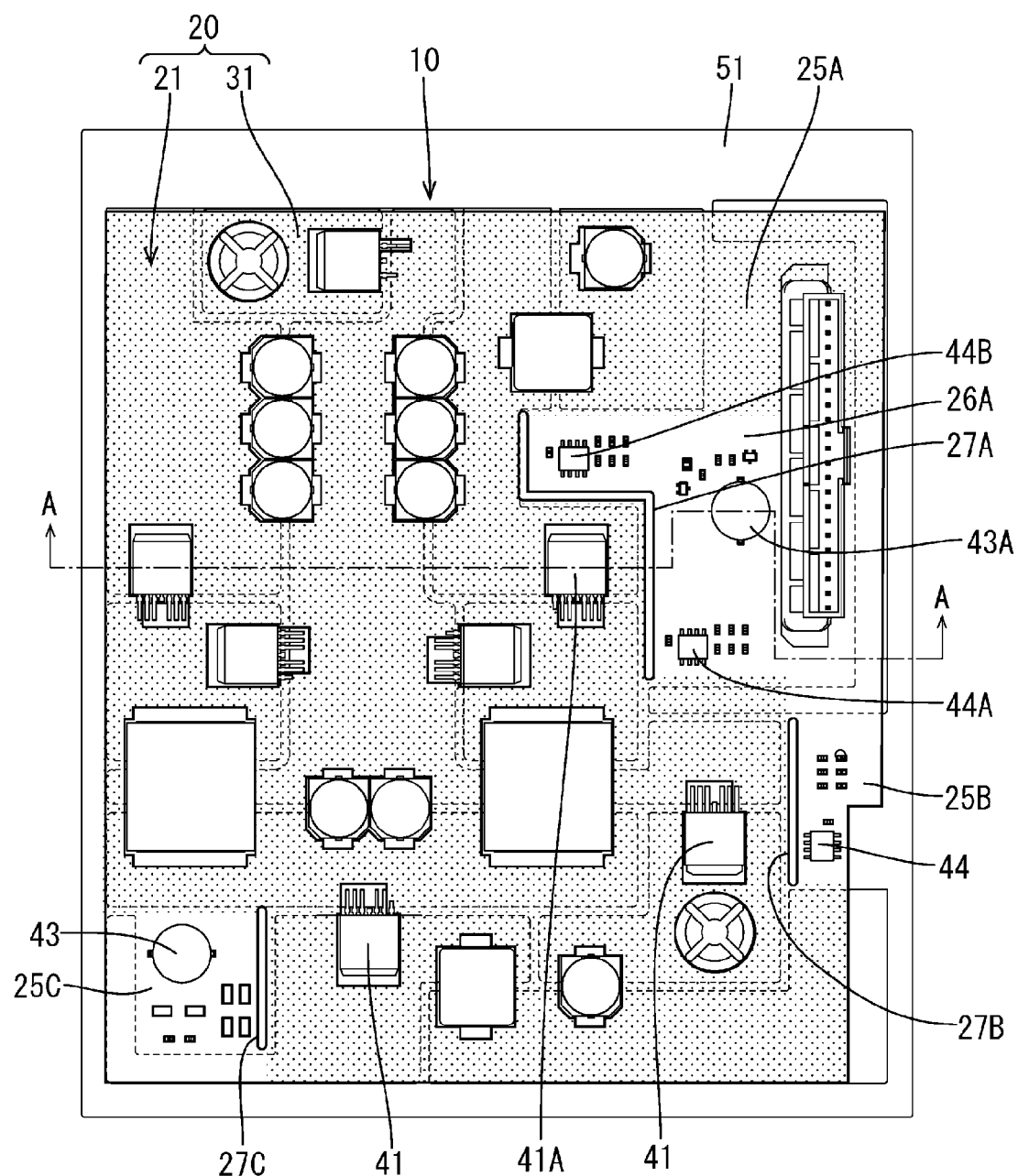
FIG. 2 is a plan view of the vehicle-mounted power distribution board according to an embodiment, in which a region in which a conductive path is disposed is indicated by hatching.
Figure 3:
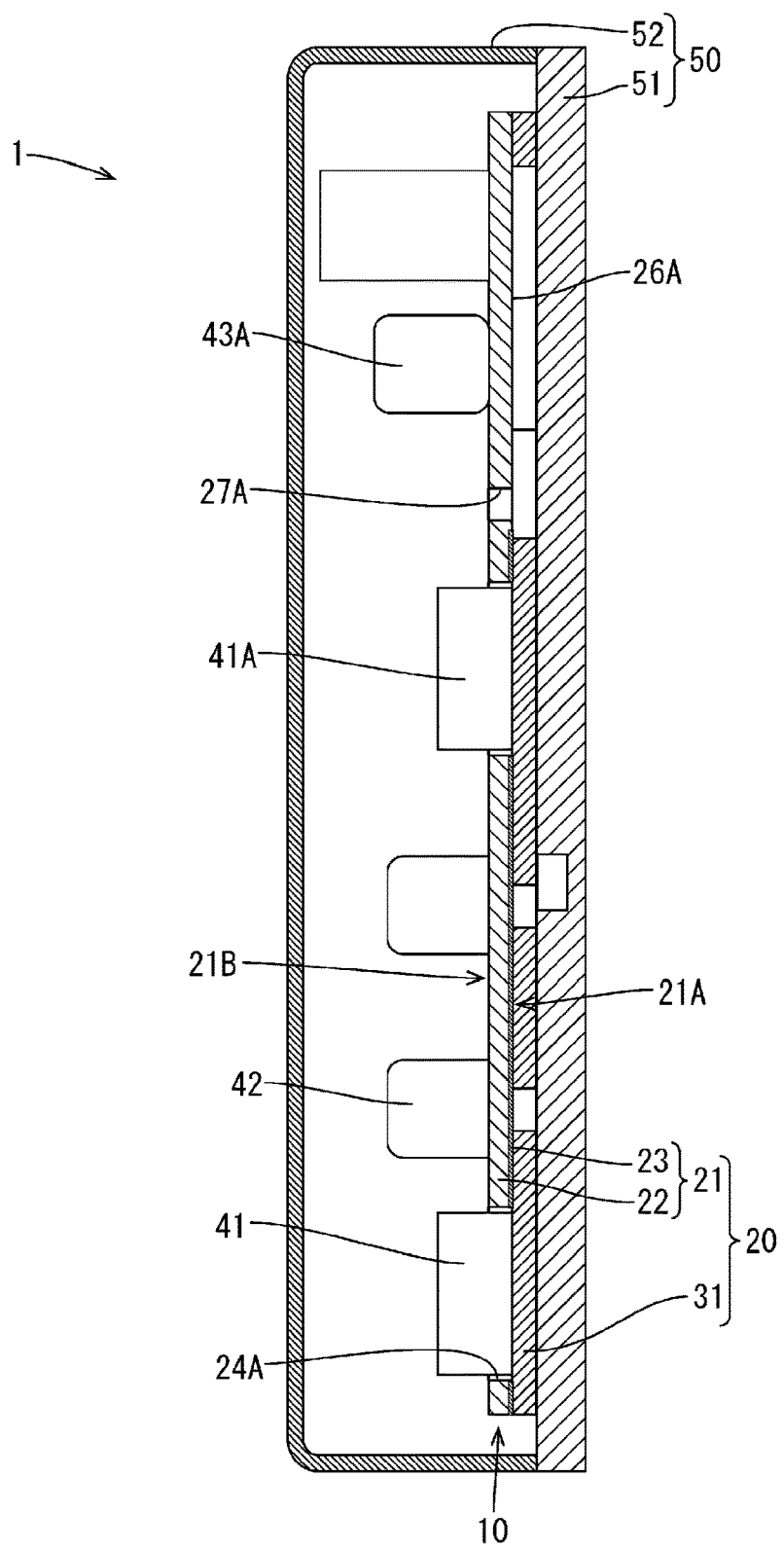
FIG. 3 is a cross-sectional view of a charging/discharging controller, taken along a position corresponding to the line A-A in FIG. 2.

An embodiment will be described with reference to FIGS. 1 to 3. A charging/discharging controller (an example of an electrical junction box) 1 according to the present embodiment is disposed in a vehicle between a power storage device (a vehicle-mounted power supply) such as a battery and various vehicle-mounted electric/electronic components, converts power supplied from the power storage device to have an appropriate voltage, thereafter distributes and supplies the power to each of the electric/electronic components, and controls switching and the like of these supplies of power.

The charging/discharging controller 1 includes a vehicle-mounted power distribution board 10 (hereinafter abbreviated as a "power distribution board 10"), and a case 50 that accommodates the power distribution board 10 thereinside. The power distribution board 10 includes a circuit structure 20 and a plurality of electronic components that are mounted to the circuit structure 20. The case 50 includes a dish-shaped lower case 51 that is overlapped with the circuit structure 20, and a box-shaped upper case 52 that is assembled to the lower case 51 so as to cover the circuit structure 20.

The plurality of electronic components include a plurality of semiconductor elements 41 constituted by FETs (Field Effect Transistors), a plurality of capacitors 42 and 43, and a plurality of ICs (Integrated Circuits) 44. Some of the plurality of electrolytic capacitors 42 and 43 are high heat resistant electrolytic capacitors 42 having a relatively high heat resistance, and the rest are low heat resistant electrolytic capacitors 43 having a lower heat resistance than the high heat resistant electrolytic capacitors 42. The semiconductor elements 41 are an example of a heat generating component that generates heat when current flows through it. The low heat resistant electrolytic capacitors 43 and the ICs 44 are an example of a low heat resistance component that is likely to be influenced by heat transferred from the heat generating component. Note that in the following description, a subscript is attached to the reference numeral when one semiconductor element 41 is described so as to be distinguished from the others, and no subscript is attached to the reference numeral when the semiconductor elements 41 are collectively referred to without distinction. The same applies to the other electronic components.

The circuit structure 20 includes a control circuit board 21 and a plurality of bus bars 31.

The control circuit board 21 is a printed circuit board having a commonly used configuration in which a conductive path 23 is formed by a printed wiring technique on a front surface and a back surface of a thin insulating plate 22 made of an insulating material such as a glass base material or a glass non-woven fabric base material. One (the bottom surface in FIG. 3) of the front and back surfaces of the control circuit board 21 constitutes a bus bar arrangement surface 21A on which the bus bars 31 are disposed, and the other surface (the upper surface in FIG. 3) is a mounting surface 21B on which the electronic components are disposed. Note that in view of ease of viewing the drawings, the conductive path 23 has been omitted in FIGS. 1 and 2. FIG. 3 shows the conductive path 23 disposed on the mounting surface 21B has been omitted, and only the conductive path 23 disposed on the bus bar arrangement surface 21A.

The control circuit board 21 includes a plurality of component insertion holes 24A and 24B for disposing electronic components. The component insertion holes 24A and 24B are holes extending through the control circuit board 21 from the bus bar arrangement surface 21A to the mounting surface 21B. The component insertion holes 24A, which constitute part of these holes, are holes for disposing the semiconductor elements 41, and are sized such that one semiconductor element 41 can be disposed inside one component insertion hole 24A. The other component insertion holes 24B are holes for disposing the high heat resistant electrolytic capacitor 42, and are sized such that three high heat resistant electrolytic capacitors 42 can be arranged inside one component insertion hole 24B.

Each of the plurality of bus bars 31 is a plate-shaped member formed of a metal having excellent conductivity. The plurality of bus bars 31 are disposed on the same plane and are spaced apart from each other. The bus bars 31 are bonded to the bus bar arrangement surface 21A of the control circuit board 21 by using a bonding member (e.g., adhesive tape, an adhesive sheet, an adhesive agent, or the like).

In a state in which the circuit structure 20 is attached to a vehicle, the circuit structure 20 is disposed in a vertical orientation, or in other words, an orientation (the orientation shown in FIG. 3) in which the plate surface direction of the control circuit board 21 coincides with a vertical direction.

Part of a region of the control circuit board 21 serves as bus bar non-arrangement regions 25A, 25B, and 25C in which no bus bar 31 is disposed.

Figure 1:
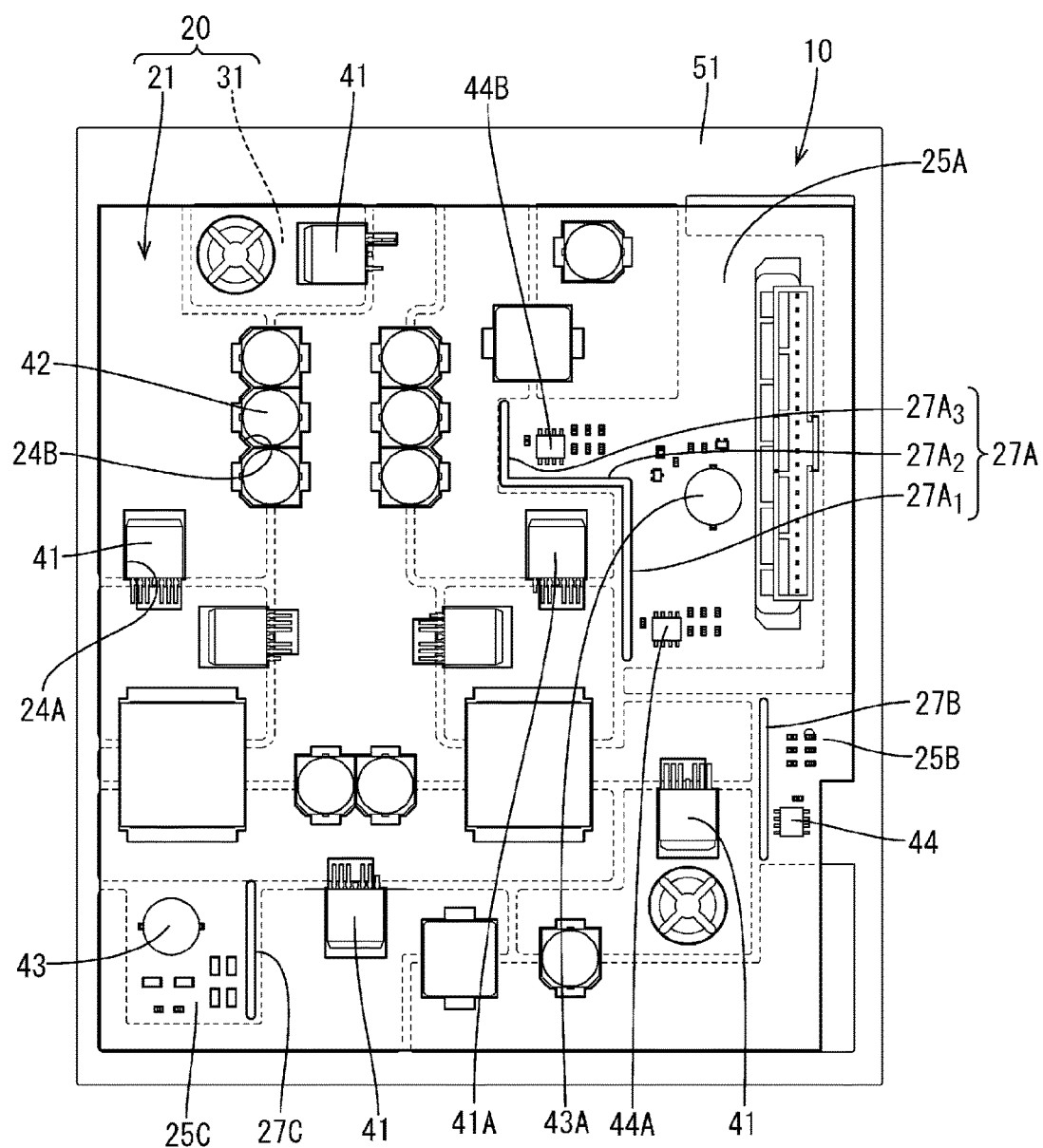
FIG. 1 is a plan view of a lower case and a vehicle-mounted power distribution board according to an embodiment.

A low heat resistant electrolytic capacitor 43A and an IC 44A, and 44B which are low heat resistance components, are disposed in one of the plurality of bus bar non-arrangement regions 25A, 25B, and 25C, namely, the bus bar non-arrangement region 25A (the bus bar non-arrangement region located on the upper right in FIG. 1). The low heat resistant electrolytic capacitor 43A and the IC 44A and 44B are disposed on the mounting surface 21B of the control circuit board 21. Although not shown in detail, the low heat resistant electrolytic capacitor 43A and the IC 44A, and 44B each have a plurality of terminals, and the terminals are connected to the conductive path 23 disposed on the mounting surface 21B.

Part of one bus bar non-arrangement region 25A serves as a conductive path non-arrangement region 26A. The conductive path non-arrangement region 26A is a region in which no conductive path 23 is disposed on the bus bar arrangement surface 21A of the control circuit board 21. In FIG. 2, the region in which the conductive path 23 is disposed on the bus bar arrangement surface 21A is indicated by hatching, and the unhatched region of the bus bar non-arrangement region 25A is the conductive path non-arrangement region 26A. The low heat resistant electrolytic capacitors 43A and the IC 44A, and 44B are disposed in the conductive path non-arrangement region 26A.

One or both of the low heat resistant electrolytic capacitor 43 and the IC 44 are also disposed in the other bus bar non-arrangement regions 25B and 25C (the bus bar non-arrangement regions located on the lower side of the bus bar non-arrangement region 25A and the lower left of the control circuit board 21 in FIG. 1). Note that as shown in FIG. 2, the entirety of the other bus bar non-arrangement regions 25B and 25C serves as the conductive path non-arrangement region.

On the other hand, the semiconductor element 41, which is a heat generating component, and the high heat resistant electrolytic capacitor 42, which is a component having a relatively high heat resistance, are disposed on the control circuit board 21 in a region in which the bus bar 31 is disposed. The semiconductor element 41 is disposed inside the corresponding component insertion hole 24A. Although not shown in detail, the semiconductor elements 41 each include a plurality of terminals. At least one of the terminals (ground terminal) is connected to the conductive path 23 disposed on the mounting surface 21B, and the other terminals (a drain terminal and a gate terminal) are connected to the bus bars 31. The high heat resistant electrolytic capacitor 42 is disposed inside the corresponding component insertion hole 24B. Although not shown in detail, the high heat resistant electrolytic capacitors 42 have a plurality of terminals, and the terminals are connected to the bus bars 31.

Slits 27A, 27B, and 27C are disposed in the bus bar non-arrangement regions 25A, 25B, and 25C, respectively. The slit 27A disposed in the bus bar non-arrangement region 25A extends along the outer peripheral edge of the bus bar non-arrangement region 25A (i.e., along a lateral edge of the bus bar 31 adjacent to the bus bar non-arrangement region 25A). The slit 27A is disposed between the low heat resistant electrolytic capacitor 43A and the IC 44A, 44B and the semiconductor element 41A adjacent thereto, and separates the low heat resistant electrolytic capacitor 43A and the IC 44A, and 44B from the semiconductor element 41A.

The slit 27A has a zigzag shape formed by a combination of a plurality of linear portions $27A_1$, $27A_2$, and $27A_3$, one linear portion $27A_1$ is disposed between one semiconductor element 41A and one low heat resistant electrolytic capacitor 43 disposed laterally with respect to the semiconductor element 41A, and extends in a vertical direction. Another linear portion $27A_2$ is disposed between one semiconductor element 41A and one IC 44B disposed upward with respect to the semiconductor element 41A, and extends in a horizontal direction. In this manner, the slit 27A separates one semiconductor element 41A and the low heat resistance component (the low heat resistant electrolytic capacitor 43A and the IC 44A or 44B) disposed laterally or upward with respect to the semiconductor element 41A.

Likewise, the slits 27B and 27C are disposed in the other bus bar non-arrangement regions 25B and 25C, and the slits 27B and 27C separate the low heat resistant electrolytic capacitor 43 or the IC 44 and the semiconductor element 41. Note that the slits 27B and 27C of the other bus bar non-arrangement regions 25B and 25C are each formed as one straight line.

As described above, according to the present embodiment, the control circuit board 21 includes the bus bar non-arrangement regions 25A, 25B, and 25C in which no bus bar 31 is disposed, and the low heat resistant electrolytic capacitor 43 and the IC 44 are disposed in the bus bar non-arrangement regions 25A, 25B, and 25C. With such a configuration, it is possible to inhibit the heat generated from the semiconductor element 41, which is a heat generating component, from being transferred through the bus bars 31 to the low heat resistant electrolytic capacitor 43 or the IC 44, which are low heat resistance components.

Part of the bus bar non-arrangement region 25A serves as the conductive path non-arrangement region 26A in which no conductive path 23 is disposed on the bus bar arrangement surface 21A, and the low heat resistant electrolytic capacitor 43A and the IC 44A, and 44B are disposed in the conductive path non-arrangement region 26A. Furthermore, the entirety of the bus bar non-arrangement regions 25A and 25B serves as the conductive path non-arrangement region, and one or both of the low heat resistant electrolytic capacitor 43 and the IC 44 are disposed in these regions. With such a configuration, it is possible to inhibit the heat generated from the semiconductor element 41 from being transferred through the conductive path 23 to the low heat resistant electrolytic capacitor 43 or the IC 44.

Furthermore, the control circuit board 21 includes the slits 27A, 27B, and 27C disposed so as to separate the semiconductor element 41 and the low heat resistant electrolytic capacitor 43 or the IC 44. With such a configuration, it is possible to inhibit the heat generated from the semiconductor element 41 from being transferred through the control circuit board 21 to the low heat resistant electrolytic capacitor 43 or the IC 44.

In addition, the circuit structure 20 is disposed in a vertical orientation in which the plate surface direction of the control circuit board 21 coincides with a vertical direction, and the slits 27A, 27B, and 27C are disposed so as to separate the semiconductor element 41 and the low heat resistant electrolytic capacitor 43 or the IC 44 disposed laterally or upward with respect to the semiconductor element 41.

Here, the surrounding air that has been heated by the heat generated from the semiconductor element 41 moves upward. Therefore, the components disposed laterally or upward with respect to the semiconductor element 41 are more likely to be influenced by heat than the components disposed downward with respect to the semiconductor element 41. Thus, by disposing the slits 27A, 27B, and 27C so as to separate the semiconductor element 41 and the low heat resistant electrolytic capacitor 43 or the IC 44 disposed laterally or upward with respect to the semiconductor element 41, it is possible to effectively inhibit transfer of heat from the semiconductor element 41 to the low heat resistant electrolytic capacitor 43 or the IC 44.

In particular, a large current flows through the charging/discharging controller 1 that is disposed between a vehicle-mounted power supply and a vehicle-mounted electric/electronic component, and controls the voltage of the power supplied from the vehicle-mounted power supply and the distribution of the power to the vehicle-mounted electric/electronic component. Therefore, handling the problem of heat generated from the heat generating component such as the semiconductor element 41 is an important issue. The power distribution board 10 having the above-described configuration can be preferably applied to such a charging/discharging controller 1.

Other Embodiments

The technology disclosed herein is not limited to the embodiment described above by way of the description and the drawings, and includes, for example, various embodiments as follows.

(1) Although the above embodiment illustrates the semiconductor element 41, the capacitors 42 and 43, and the IC 44 as an example of the electronic component, other electronic components may also be mounted to the circuit structure as needed.

(2) The shape and the size of the component insertion holes 24A and 24B are not limited to those described in the above embodiment, and may be any shape and any size corresponding to the shape and the size of the bottom surface of electronic components disposed thereinside, and the number of such electronic components.

(3) Although the circuit structure 20 includes the three bus bar non-arrangement regions 25A, 25B, and 25C in the above embodiment, the number, the outside shape, the arrangement positions, and the like of the bus bar non-arrangement regions are not limited to those described in the embodiment, and may be set in accordance with the type, the number, and the like of the electronic components disposed therein. Likewise, the number, the shape, the arrangement, and the like of the conductive path non-arrangement regions and the slits are not limited to those described in the embodiment, and may be set in accordance with the types, the number, and the like of the electronic components disposed therein.

(4) Although the conductive path non-arrangement region 26A is a region in which no conductive path 23 is disposed on the bus bar arrangement surface 21A of the control circuit board 21 in the above embodiment, the conductive path non-arrangement region may be a region in which no conductive path is disposed on the mounting surface of the control circuit board, or may be a region in which no conductive path is disposed on both the mounting surface and the bus bar arrangement surface.

(5) Although one slit 27A has a zigzag shape and the other slits 27B and 27C have the shape of a straight line in the above embodiment, the shapes of the slits are not limited to those described in the present embodiment, and may be a U-shape or C-shape, for example.

The invention claimed is:

1. A vehicle-mounted power distribution board comprising:
   a circuit structure including a control circuit board including a conductive path disposed on each of a bus bar arrangement surface and a mounting surface of the circuit board, and a plurality of bus bars placed on the bus bar arrangement surface of the control circuit board; and
   a plurality of electronic components that are mounted to the mounting surface of the circuit board, wherein
   the plurality of electronic components include a heat generating component that generates heat when current flows through the heat generating component, and a low heat resistance component that is influenced by heat transferred from the heat generating component,
   the circuit structure is provided with a bus bar non-arrangement region defined by a gap formed between a pair of opposing sides of an adjacent pair of the plurality of bus bars, and
   the low heat resistance component is disposed adjacent the bus bar non-arrangement region.

2. The vehicle-mounted power distribution board according to claim 1, wherein at least part of the bus bar non-arrangement region serves as a conductive path non-arrangement region in which the conductive path is not disposed on the bus bar arrangement surface of the control circuit board, and the low heat resistance component is disposed in the conductive path non-arrangement region.

3. The vehicle-mounted power distribution board according to claim 2, wherein the control circuit board includes a slit that separates the heat generating component and the low heat resistance component.

4. The vehicle-mounted power distribution board according to claim 1, wherein the control circuit board includes a slit that separates the heat generating component and the low heat resistance component.

5. The vehicle-mounted power distribution board according to claim 4, wherein the circuit structure is disposed in a vertical orientation, the low heat resistance component is disposed laterally or upward of the heat generating component that is mounted to the circuit structure, and the slit is disposed so as to separate the heat generating component and the low heat resistance component.

6. An electrical junction box comprising:
   the vehicle-mounted power distribution board according to claim 1; and a case that accommodates the vehicle-mounted power distribution board.

7. A charging/discharging controller that is disposed between a vehicle-mounted power supply and a vehicle-mounted electric/electronic component and that controls a voltage of power supplied from the vehicle-mounted power supply and distribution of power to the vehicle-mounted electric/electronic component, comprising:
   the vehicle-mounted power distribution board according to claim 1; and a case that accommodates the vehicle-mounted power distribution board.

8. An electrical junction box comprising:
   the vehicle-mounted power distribution board according to claim 2; and a case that accommodates the vehicle-mounted power distribution board.

9. A charging/discharging controller that is disposed between a vehicle-mounted power supply and a vehicle-mounted electric/electronic component and that controls a voltage of power supplied from the vehicle-mounted power supply and distribution of power to the vehicle-mounted electric/electronic component, comprising:
   the vehicle-mounted power distribution board according to claim 2; and a case that accommodates the vehicle-mounted power distribution board.

10. An electrical junction box comprising:
    the vehicle-mounted power distribution board according to claim 4; and a case that accommodates the vehicle-mounted power distribution board.

11. A charging/discharging controller that is disposed between a vehicle-mounted power supply and a vehicle-mounted electric/electronic component and that controls a voltage of power supplied from the vehicle-mounted power supply and distribution of power to the vehicle-mounted electric/electronic component, comprising:
    the vehicle-mounted power distribution board according to claim 4; and a case that accommodates the vehicle-mounted power distribution board.

12. An electrical junction box comprising:
    the vehicle-mounted power distribution board according to claim 5; and a case that accommodates the vehicle-mounted power distribution board.

13. A charging/discharging controller that is disposed between a vehicle-mounted power supply and a vehicle-mounted electric/electronic component and that controls a voltage of power supplied from the vehicle-mounted power supply and distribution of power to the vehicle-mounted electric/electronic component, comprising:
    the vehicle-mounted power distribution board according to claim 5; and a case that accommodates the vehicle-mounted power distribution board.

* * * * *